(12) United States Patent
Katsube et al.

(10) Patent No.: US 8,383,533 B2
(45) Date of Patent: *Feb. 26, 2013

(54) LOW-TEMPERATURE SINTERING CERAMIC MATERIAL AND CERAMIC SUBSTRATE

(75) Inventors: Tsuyoshi Katsube, Nagaokakyo (JP); Machiko Motoya, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/176,770

(22) Filed: Jul. 6, 2011

(65) Prior Publication Data

US 2011/0284270 A1    Nov. 24, 2011

Related U.S. Application Data

(63) Continuation of application No. PCT/JP2009/071446, filed on Dec. 24, 2009.

(30) Foreign Application Priority Data

Jan. 7, 2009  (JP) ................................. 2009-001741
Feb. 10, 2009  (JP) ................................. 2009-028476

(51) Int. Cl.
    *C04B 35/195* (2006.01)
(52) U.S. Cl. ......... 501/125; 501/128; 428/210; 428/901
(58) Field of Classification Search .............. 501/125, 501/128; 428/210, 901
See application file for complete search history.

(56) References Cited

U.S. PATENT DOCUMENTS

| | | | |
|---|---|---|---|
| 6,241,838 B1 | 6/2001 | Sakamoto et al. | |
| 8,173,565 B2 * | 5/2012 | Katsube | 501/135 |
| 2010/0139957 A1 * | 6/2010 | Motoya et al. | 174/257 |
| 2011/0284270 A1 * | 11/2011 | Katsube et al. | 174/251 |
| 2011/0300355 A1 * | 12/2011 | Katsube | 428/210 |

FOREIGN PATENT DOCUMENTS

| | | |
|---|---|---|
| JP | 48-48999 A | 7/1973 |
| JP | 11-163530 A | 6/1999 |
| JP | 2001-253775 A | 9/2001 |
| JP | 2002-173362 A | 6/2002 |
| JP | 2003-221277 A | 8/2003 |
| JP | 3466561 B2 | 8/2003 |
| JP | 2006-001755 A | 1/2006 |
| JP | 2006-151775 A | 6/2006 |

(Continued)

OTHER PUBLICATIONS

Official Communication issued in International Patent Application No. PCT/JP2009/071446, mailed on Mar. 9, 2010.

*Primary Examiner* — Karl Group
(74) *Attorney, Agent, or Firm* — Keating & Bennett, LLP

(57) ABSTRACT

A low-temperature sintering ceramic material showing little variation in composition after firing, realizing high bending strength in a sintered body, and capable of forming a reliable ceramic substrate showing high peel strength of a surface electrode includes a main constituent ceramic material containing about 48 weight % to about 75 weight % in terms of $SiO_2$ of Si, about 20 weight % to about 40 weight % in terms of BaO of Ba, and about 5 weight % to about 20 weight % in terms of $Al_2O_3$ of Al, and an accessory constituent ceramic material containing, relative to 100 parts by weight of the main constituent ceramic material, about 2 parts to about 10 parts by weight in terms of MnO of Mn and about 0.1 parts to about 10 parts by weight respectively in terms of $TiO_2$ and $Fe_2O_3$ of at least one selected from Ti and Fe, and substantially not includes both Cr oxide and B oxide.

8 Claims, 1 Drawing Sheet

FOREIGN PATENT DOCUMENTS

| | | |
|---|---|---|
| JP | 2008-044829 A | 2/2008 |
| WO | 2009/025156 A1 | 2/2009 |
| WO | 2010092969 * | 8/2010 |
| WO | 2010092970 * | 8/2010 |

* cited by examiner

LOW-TEMPERATURE SINTERING CERAMIC MATERIAL AND CERAMIC SUBSTRATE

BACKGROUND OF THE INVENTION

1. Field of the Invention

The present invention relates to a low-temperature sintering ceramic material co-sinterable with a low-melting point metal material such as silver or copper, and a ceramic substrate made of such a low-temperature sintering ceramic material, and further relates to a multilayer ceramic substrate.

2. Description of the Related Art

A low-temperature sintering ceramic (LTCC: Low Temperature Cofired Ceramic) material is often used as a substrate material for a high frequency module in an information communication terminal or the like because it can be co-fired with a low-melting point metal material such as silver or copper having a small specific resistance, and can form a multilayer ceramic substrate having excellent high frequency characteristics.

As a low-temperature sintering ceramic material, a so-called glass ceramic composite system in which a $B_2O_3$-$SiO_2$-based glass material is mixed into a ceramic material such as $Al_2O_3$ is generally known, however, in this system, relatively expensive glass needs to be used as a starting material, and boron that is likely to volatilize during firing is contained, so that the composition of an obtained substrate tends to vary, and also management thereof is complicated because a special sheath or sagger should be used.

For addressing this, low-temperature sintering ceramic materials described, for example, in Japanese Patent Application Laid-open No. 2002-173362 and Japanese Patent Application Laid-open No. 2008-044829 have been proposed. The low-temperature sintering ceramic materials described in these documents will not encounter the problems as described above because they do not use glass as a starting material, and are non-glass based low-temperature sintering ceramic materials not containing boron.

However, since a ceramic substrate obtained from the low-temperature sintering ceramic materials described in these documents has a bending strength of about 150 to 200 MPa, the strength of the substrate itself can be insufficient depending on the use application or the bonding strength with an external conductor film formed on surface of the substrate can be insufficient.

SUMMARY OF THE INVENTION

In view of the above circumstances and problems, preferred embodiments of the present invention provide a low-temperature sintering ceramic material not using glass as a starting material and not containing boron, and having minimal variations in composition after firing, the low-temperature sintering ceramic material realizing high strength of a ceramic substrate that is obtained by sintering the same, and forming a reliable ceramic substrate having excellent bonding strength with an external conductor film.

In addition, preferred embodiments of the present invention provide a ceramic substrate made of the aforementioned low-temperature sintering ceramic material.

The low-temperature sintering ceramic material according to a preferred embodiment of the present invention includes a main constituent ceramic material containing about 48 weight % to about 75 weight % in terms of $SiO_2$ of Si, about 20 weight % to about 40 weight % in terms of BaO of Ba, and about 5 weight % to about 20 weight % in terms of $Al_2O_3$ of Al, and an accessory constituent ceramic material containing, relative to 100 parts by weight of the main constituent ceramic material, about 2 parts to about 10 parts by weight in terms of MnO of Mn and about 0.1 parts to about 10 parts by weight respectively in terms of $TiO_2$ and $Fe_2O_3$ of at least one selected from Ti and Fe, and substantially not including either of Cr oxide and B oxide.

Also, another preferred embodiment of the present invention is directed to a ceramic substrate including a ceramic layer made of sintered low-temperature sintering ceramic material according to a preferred embodiment of the present invention.

Since the low-temperature sintering ceramic material of various preferred embodiments of the present invention substantially does not include glass as a starting material, and does not include boron, a composition of a ceramic substrate that is obtained by sintering the same is prevented from varying, and the firing process of the same is easy to be managed. Furthermore, a ceramic substrate obtained by firing the low-temperature sintering ceramic material is highly reliable as it has excellent bending strength, high strength by the substrate itself, excellent electrode peel strength, and high bonding strength with an external conductor film.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
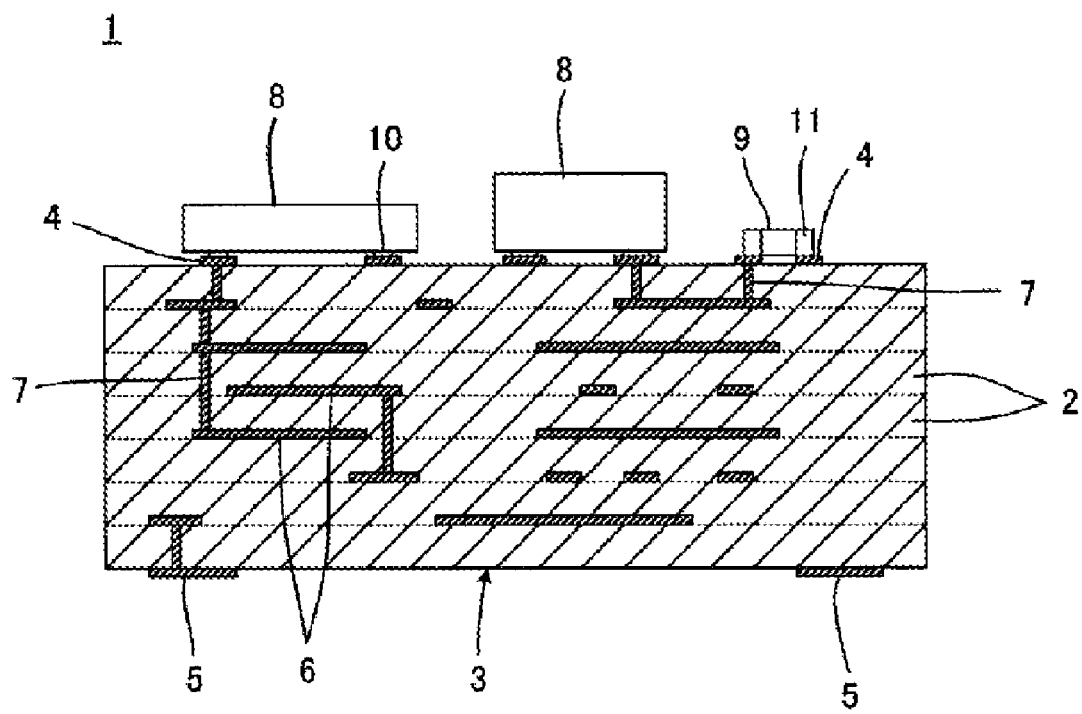
FIG. 1 is a sectional view schematically showing a multilayer ceramic substrate 1 according to a first preferred embodiment formed by using a low-temperature sintering ceramic material according to the present invention.

A low-temperature sintering ceramic material according to a preferred embodiment of the present invention preferably includes a main constituent ceramic material containing about 48 weight % to about 75 weight % in terms of $SiO_2$ of Si, about 20 weight % to about 40 weight % in terms of BaO of Ba, and about 5 weight % to about 20 weight % in terms of $Al_2O_3$ of Al, and an accessory constituent ceramic material containing, relative to 100 parts by weight of the main constituent ceramic material, about 2 parts to about 10 parts by weight in terms of MnO of Mn and about 0.1 parts to about 10 parts by weight respectively in terms of $TiO_2$ and $Fe_2O_3$ of at least one selected from Ti and Fe, and substantially not including either of Cr oxide and B oxide.

Since the low-temperature sintering ceramic material is a non-glass-based low-temperature sintering ceramic material not using glass as a starting material and not containing boron, composition of a ceramic substrate obtained by sintering the same is prevented from varying, and the firing process of the same is easy to be managed. Further, as is apparent from experimental examples as will be described later, the obtained ceramic substrate is highly reliable as it has a bending strength of about 230 MPa or more, high strength by the substrate itself, and has an electrode peel strength of about 20 N/2 mm² or more, and has a high bonding strength with an external conductor film. Further, the environmental tolerance against high temperature, high humidity and the like of the obtained ceramic substrate is improved, and also chemical tolerance of the substrate is improved as is evidenced from the ability of preventing elution of the substrate constituents into a plating liquid. Furthermore, a ceramic substrate with little amorphous portions, capable of promoting crystallization, and a high Qf value is obtained.

Here, the main constituent ceramic material containing about 48 weight % to about 75 weight % in terms of $SiO_2$ of Si, about 20 weight % to about 40 weight % in terms of BaO of Ba, and about 5 weight % to about 20 weight % in terms of $Al_2O_3$ of Al is a basic constituent of the obtained ceramic substrate, and greatly contributes to obtaining a ceramic substrate having large insulation resistance, small relative permittivity, and small dielectric loss.

On the other hand, Mn (particularly MnO) which is the accessory constituent ceramic material is likely to form a liquid phase constituent by reacting with the $SiO_2$—BaO—$Al_2O_3$ based main constituent ceramic material, and acts as a sintering assistant by lowering the viscosity of the starting material at the time of firing, however, it has much smaller volatility than $B_2O_3$ similarly functioning as a sintering assistance. This contributes to reducing the firing variation, facilitating the management of the firing, and improving the mass productivity.

Although a specific mechanism is unknown, Ti (particularly $TiO_2$) is able to increase the reactivity between the ceramic layer formed of the low-temperature sintering ceramic material and the external conductor film formed of the low-melting point metal material such as copper, and is able to improve the bonding strength between the ceramic layer and the external conductor film by the co-firing process. As a result, a rigid solder joint is formed between an active device such as a semiconductor device or a passive device such as a chip capacitor mounted on the ceramic substrate, and the ceramic substrate, and joint breakage due to an impact such as dropping is reliably prevented.

Similarly, in the case of the Fe (particularly $Fe_2O_3$), it is possible to increase the reactivity between the ceramic layer formed of the low-temperature sintering ceramic material and the external conductor film formed of the low-melting point metal material such as copper, and the bonding strength between the ceramic layer and the external conductor film by the co-firing process can be improved. As a result, a rigid solder joint is formed between a device mounted on the ceramic substrate and the ceramic substrate, and joint breakage due to an impact such as dropping can be prevented.

Further, since the low-temperature sintering ceramic material according to a preferred embodiment of the present invention substantially does not include B oxide (particularly $B_2O_3$), it is possible to reduce the variation in composition when it is fired, and management of the firing process can be facilitated as there is no need to use a special sheath or sugger. Further, since Cr oxide (particularly $Cr_2O_3$) is not substantially included, Q value in the microwave band is prevented from decreasing, and, for example, a Qf value of 1000 or more can be obtained at 3 GHz. Here the term "substantially" means that B oxide and Cr oxide may be contained as impurities in an amount of less than approximately 0.1 weight %, for example. That is, even when B oxide and Cr oxide are included as impurities, the effects and advantages of the present preferred embodiment of the present invention are obtained as long as the amount is less than approximately 0.1 weight %.

Preferably, the low-temperature sintering ceramic material according to a preferred embodiment of the present invention does not contain alkaline metal oxides such as $Li_2O$ and $Na_2O$. This is because similarly to $B_2O_3$, these alkaline metal oxides are also easy to volatilize at the time of firing likewise, and may lead variation in composition of the obtained substrate. Further, when these alkaline metal oxides are not included, environmental tolerance against high temperature, high humidity and the like is improved, and chemical resistance such as ability of preventing elution into a plating liquid can also be improved.

In the low-temperature sintering ceramic material according to a preferred embodiment of the present invention, it is preferred that, as the accessory constituent ceramic material, about 0.1 parts to about 5 parts by weight in terms of MgO of Mg is further contained, relative to 100 parts by weight of the main constituent ceramic material. In this manner, when Mg (particularly MgO) is contained, crystallization of the low-temperature sintering ceramic material during firing is promoted, and as a result, a volume amount of the liquid phase portion that will cause reduction in substrate strength can be reduced, and bending strength of the obtained ceramic substrate can further be improved.

Further, in the low-temperature sintering ceramic material according to a preferred embodiment of the present invention, it is preferred that as the accessory constituent ceramic material, about 0.1 parts to about 6 parts by weight in terms of respectively $Nb_2O_5$, $CeO_2$, $ZrO_2$ and ZnO of at least one selected from Nb, Ce, Zr and Zn is further contained, relative to 100 parts by weight of the main constituent ceramic material. When at least one selected from Nb, Ce, Zr and Zn (particularly at least one oxide selected from $Nb_2O_5$, $CeO_2$, $ZrO_2$ and ZnO), an adding amount of Mn (particularly MnO) that is likely to remain as a amorphous constituent can be reduced, and as a result, a volume amount of the liquid phase portion that will cause reduction in substrate strength can be reduced, and bending strength of the obtained ceramic substrate can further be improved.

Further, the low-temperature sintering ceramic material according to a preferred embodiment of the present invention may further contain as the accessory constituent ceramic material, about 0.1 parts to about 5.0 parts by weight in terms of CoO and $V_2O_5$ of Co and/or V, relative to 100 parts by weight of the main constituent ceramic material. These constituents are able to further improve the bending strength of the obtained ceramic substrate and function as coloring agents.

Although the low-temperature sintering ceramic material according to a preferred embodiment of the present invention does not contain glass as a starting constituent as described above, glass which is an amorphous constituent is generated during the firing cycle, and the fired ceramic substrate contains glass. Therefore, it is possible to produce a low-temperature fired ceramic substrate stably without using expensive glass. Further, as described above, the low-temperature sintering ceramic material according to a preferred embodiment of the present invention preferably does not contain alkaline metal.

The low-temperature sintering ceramic material according to a preferred embodiment of the present invention can be produced by adding and mixing ceramic powder of $MnCO_3$, and ceramic powder of at least one of $TiO_2$ and $Fe_2O_3$ into respective ceramic powders of $SiO_2$, $BaCO_3$ and $Al_2O_3$. Preferably, it is produced through the step of calcining a mixture prepared by adding ceramic powder of at least one of $TiO_2$ and $Fe_2O_3$ to respective ceramic powders of $SiO_2$, $BaCO_3$ and $Al_2O_3$, thereby preparing calcined powder, and the step of adding the calcined powder with uncalcined ceramic powder of $MnCO_3$.

Therefore, a ceramic green sheet containing the low-temperature sintering ceramic material is preferably produced through the step of calcining a mixture prepared by adding ceramic powder of at least one of $TiO_2$ and $Fe_2O_3$ to respective ceramic powders of $SiO_2$, $BaCO_3$ and $Al_2O_3$, thereby preparing calcined powder, the step of adding the calcined powder with uncalcined ceramic powder of $MnCO_3$ and with a binder, thereby preparing a ceramic slurry, and the step of molding the ceramic slurry, thereby forming a ceramic green sheet.

As described above, in production of the low-temperature sintering ceramic material or the ceramic green sheet, by adding an uncalcined Mn constituent to calcined powder after obtaining the calcined powder by calcining a Si constituent, a Ba constituent, an Al constituent and a Ti/Fe constituent, the reaction of calcining synthesis is prevented during the calcination, so that the grain size of the calcined powder can be made very small. Therefore, the grinding step of the calcined powder can be simplified, and thinning of the ceramic green sheet produced by using the same can be readily advanced. Further, it is possible to prevent the calcined powder from turning dark brown, and hence it is possible to improve the image recognition performance of the ceramic green sheet produced by using such calcined powder, particularly in printing a conductive paste mainly based on copper.

The ceramic layer provided in the ceramic substrate formed by using a low-temperature sintering ceramic material according to a preferred embodiment of the present invention includes $TiO_2$ as the accessory constituent ceramic material of the low-temperature sintering ceramic material, and it is desired that the ceramic layer formed by sintering the low-temperature sintering ceramic material precipitates $Ba_2TiSi_2O_8$ crystals. That is, when $TiO_2$ is included as the accessory constituent ceramic material, and the main constituent ceramic material and the accessory constituent ceramic material have specific compositions as described above, $Ba_2TiSi_2O_8$ crystals (Fresnoite crystal phase) precipitate in the obtained ceramic substrate, and as a result, higher electrode peel strength is obtained, and a ceramic substrate having extremely high bonding strength with the external conductor film and high reliability can be obtained.

Next, based on the first and the second preferred embodiments of the present invention, a ceramic substrate formed by using the low-temperature sintering ceramic material of a preferred embodiment of the present invention, and a production method thereof will be described.

First Preferred Embodiment

FIG. 1 is a sectional view schematically showing a multilayer ceramic substrate 1 as one example of a ceramic substrate produced by using a low-temperature sintering ceramic material of a preferred embodiment of the present invention.

The multilayer ceramic substrate 1 includes a laminate including a plurality of stacked ceramic layers 2. In this laminate 3, various conductor patterns are provided in association with specific ones of the ceramic layers 2.

The aforementioned conductor pattern includes several external conductor films 4 and 5 arranged on the end surface in the stacking direction of the laminate 3, several internal conductor films 6 arranged along a specific interface between the ceramic layers 2, and a via hole conductor 7 arranged so as to penetrate a specific ones of the ceramic layers 2 and functioning as an interlayer connecting conductor.

The external conductor film 4 located on the surface of the laminate 3 is preferably used to connect to electronic components 8 and 9 to be mounted on the external surface of the laminate 3. In FIG. 1, for example, the electronic component 8 includes a bump electrode 10 similar to a semiconductor device, and the electronic component 9 includes a planar terminal electrode 11 similar to a chip capacitor. The external conductor film 5 provided on the back surface of the laminate 3 is preferably used to connect to a mother board (not illustrated) on which the multilayer ceramic substrate 1 is mounted.

The laminate 3 provided in the multilayer ceramic substrate 1 is obtained by firing an unfired laminate including a plurality of stacked ceramic green layers that are to become the ceramic layers 2, and the internal conductor film 6 and the via hole conductor 7 formed of a conductive paste, and sometimes further including the external conductor films 4 and 5 formed of a conductive paste.

The laminate structure of the ceramic green layers in the unfired laminate as described above is preferably defined by stacking a plurality of ceramic green sheets obtained by molding a ceramic slurry, and the conductor pattern, in particular, the internal conductor pattern is provided on the ceramic green sheets before stacking.

The ceramic slurry can be obtained by adding the low-temperature sintering ceramic material according to a preferred embodiment of the present invention described above with an organic binder such as polyvinyl butyral, a solvent such as toluene and isopropyl alcohol, a plasticizer such as di-n-butylphthalate, and an additive such as a dispersing agent as is necessary and making it into slurry.

In the molding for obtaining the ceramic green sheet using the ceramic slurry, for example, the ceramic slurry is preferably molded into a sheet-shaped form by applying a doctor blade method on a carrier film formed of an organic resin such as polyethylene terephthalate.

In providing the ceramic green sheet with the conductor pattern, for example, a conductive paste containing a low-temperature sintering metal material such as gold, silver or copper as a main constituent of the conductive constituent is preferably used, and the ceramic green sheet is provided with a through hole for the via hole conductor 7, and the through hole is charged with the conductive paste, and a conductive paste film for the internal conductor film 6 and conductive paste films for the external conductor films 4 and 5 are formed, for example, by a screen printing method. The low-temperature sintering ceramic material according to a preferred embodiment of the present invention is excellent in sintering performance, in particular, with a conductive paste mainly based on copper, among the low-temperature sintering metal materials as described above.

Such ceramic green sheets are stacked in a predetermined order, and pressure bonded, for example, at a pressure of about 1000 kgf/cm² to about 1500 kgf/cm² in the stacking direction, so that an unfired laminate is obtained. Although not illustrated in the drawings, the unfired laminate may be provided with a cavity for accommodating other electronic component, and a joint portion for fixing a cover that covers the electronic components 8 and 9 and so on.

The unfired laminate is fired in a temperature range that is equal to or higher than the temperature at which the low-temperature sintering ceramic material contained in the ceramic green layer can be sintered, for example, 850° C. or higher, and is lower than or equal to a melting point of the metal contained in the conductor pattern, for example, about 1050° C. or less for copper. As a result, the ceramic green layer is sintered, and the conductive paste is also sintered, so that a circuit pattern by the sintered conductor film is formed.

In particular, when the main constituent metal contained in the conductor pattern is copper, the firing is conducted in a non-oxidative atmosphere such as nitrogen atmosphere, and binder removal is completed at a temperature of about 900° C. or less, and oxygen partial pressure is reduced at the time of lowering the temperature so that copper will not be substantially oxidized at the time of completion of the firing. When the firing temperature is, for example, about 980° C. or higher, it is difficult to use silver as the metal contained in the conductor pattern, however, it can be used for an Ag-Pd based alloy containing about 20 weight % or more palladium. In this case, firing can be conducted in the air. When the firing temperature is about 950° C. or less, for example, silver may be used as the metal contained in the conductor pattern.

As described above, at the end of the firing step, the laminate 3 shown in FIG. 1 is obtained.

Thereafter, the electronic components 8 and 9 are mounted, and as a result, the multilayer ceramic substrate 1 shown in FIG. 1 is completed.

Various preferred embodiments of the present invention can be applied not only to the multilayer ceramic substrate including the laminate with the lamination structure as described above, but also to a ceramic substrate with a single-layer structure having only one ceramic layer. Also preferred embodiments of the present invention can be applied to a composite type multilayer ceramic substrate composed of a ceramic layer formed of the low-temperature sintering ceramic material, and a ceramic layer composed of other low-temperature sintering ceramic material having high dielectric constant.

Second Preferred Embodiment

Figure 2:
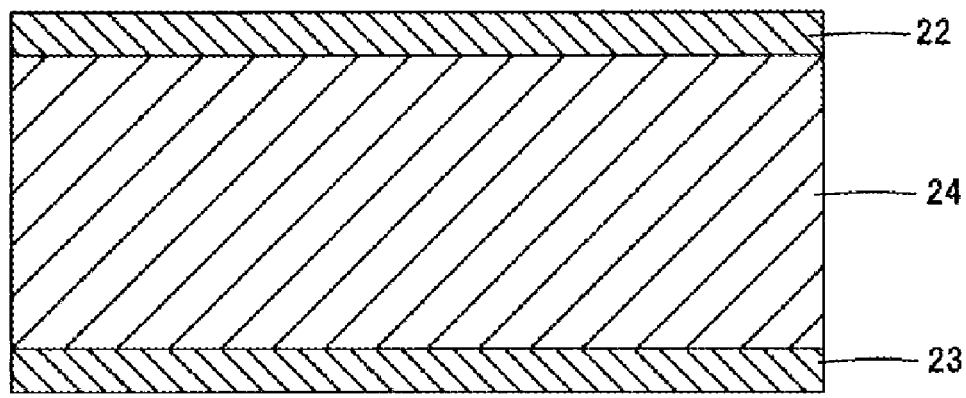
FIG. 2 is a sectional view schematically showing a ceramic substrate 21 according to a second preferred embodiment formed by using a low-temperature sintering ceramic material according to the present invention.

FIG. 2 is a sectional view schematically showing a ceramic substrate 21 according to a second preferred embodiment made of a low-temperature sintering ceramic material according to a preferred embodiment of the present invention.

The ceramic substrate 21 has a lamination structure including a first and a second superficial ceramic portions 22 and 23 having a predetermined thermal expansion coefficient $\alpha 1$, and an inner layer ceramic portion 24 having a thermal expansion coefficient $\alpha 2$ that is larger than the thermal expansion coefficient $\alpha 1$, located between the first and the second superficial ceramic portions 22 and 23.

In the ceramic substrate 21 described above, any of the first and the second superficial ceramic portions 22 and 23 and the inner layer ceramic portion 24 are made of sintered bodies of the low-temperature sintering ceramic material of the present invention.

In the ceramic substrate 21, by selecting the relationship between the thermal expansion coefficient $\alpha 1$ of the first and the second superficial ceramic portions 22 and 23 and the thermal expansion coefficient $\alpha 2$ of the inner layer ceramic portion 24 as described above, compressive stress from the inner layer ceramic portion 24 is exerted on each of the first and the second superficial ceramic portions 22 and 23 in a cooling process after the firing step executed for production of the ceramic substrate 21. From this, it is possible to improve the deflective strength of the ceramic substrate 21.

For securely achieving the operation and advantageous effects as described above, the difference between the thermal expansion coefficient $\alpha 1$ and the thermal expansion coefficient $\alpha 2$ is preferably about 0.5 ppm/° C. or more, and each thickness of each of the superficial ceramic portions 22 and 23 is preferably about 150 µm or less, for example.

Further, since any of the first and the second superficial ceramic portions 22 and 23 and the inner layer ceramic portion 24 are made of sintered bodies of the low-temperature sintering ceramic material according to a preferred embodiment of the present invention, firing can be conducted at a relatively low temperature, and the ceramic substrate 21 has excellent high frequency characteristics. Further, since the superficial ceramic portions 22 and 23 and the inner layer ceramic portion 24 are formed of ceramic sintered bodies of substantially the same composition, cracks and warpage are prevented from occurring even when the thermal expansion coefficients differ from each other as described above, and excellent reliability of the ceramic substrate 21 is achieved.

Specific composition examples of the low-temperature sintering ceramic material according to a preferred embodiment of the present invention that can become each of the superficial ceramic portions 22 and 23 and the inner layer ceramic portion 24 having the relationship of the thermal expansion coefficients as described above will be clarified in the later-described experimental examples.

In FIG. 2, illustration of the conductor pattern provided in association with the ceramic substrate 21 is omitted. As the conductor pattern, besides the external conductor film provided on the outer surface of the ceramic substrate 21, the internal conductor film, the via hole conductor and the like provided inside the ceramic substrate 21 are recited.

When the internal conductor film or the via hole conductor is provided as described above, it is usual that each of the superficial ceramic portions 22 and 23 provided in the ceramic substrate 21 has a lamination structure including a plurality of layers, or the inner layer ceramic portion 24 has a lamination structure including a plurality of layers, however, illustration of these lamination structures are omitted in FIG. 2.

Next, experimental examples carried out according to various preferred embodiments of the present invention will be described.

Experimental Example 1

Experimental example 1 was carried out for examining advantageous effects of preferred embodiments of the present invention.

First, as a starting material, ceramic powders of $SiO_2$, $BaCO_3$, $Al_2O_3$, $MnCO_3$, $TiO_2$, $Fe_2O_3$, $Mg(OH)_2$, $Nb_2O_5$, $CeO_2$, $ZrO_2$ and ZnO respectively having a grain size of 2.0 µm or less were prepared. Next, these starting material powders were weighed so that the composition ratios shown in Table 1 and Table 2 were achieved after firing, wet mixed and ground, and then dried, and the obtained mixture was calcined at 750 to 1000° C. for 1 to 3 hours, to obtain a raw material powder. The $BaCO_3$ turns into BaO after firing, and the $MnCO_3$ turns into MnO after firing, and the $Mg(OH)_2$ turns into MgO after firing.

In Table 1 and Table 2, the main constituent ceramic material of $SiO_2$, BaO and $Al_2O_3$ is represented by weight % (wt %), and the total of these is 100 weight %. On the other hand, the accessory constituent ceramic material of MnO, $TiO_2$, $Fe_2O_3$, MgO, $Nb_2O_5$, $CeO_2$, $ZrO_2$ and ZnO is represented by a ratio to 100 parts by weight of the main constituent ceramic by parts by weight.

TABLE 1

| Sample No. | Main constituent (wt %) | | | Accessory constituent (parts by weight) | | | | | | | |
|---|---|---|---|---|---|---|---|---|---|---|---|
| | SiO$_2$ | BaO | Al$_2$O$_3$ | MnO | TiO$_2$ | Fe$_2$O$_3$ | MgO | Nb$_2$O$_5$ | CeO$_2$ | ZrO$_2$ | ZnO |
| 1 | 57 | 31 | 12 | 6.5 | 0.1 | — | — | — | — | — | — |
| 2 | 57 | 31 | 12 | 6 | 0.5 | — | — | — | — | — | — |
| 3 | 57 | 31 | 12 | 5 | 1.5 | — | — | — | — | — | — |
| 4 | 57 | 31 | 12 | 4 | 3 | — | — | — | — | — | — |
| 5 | 57 | 31 | 12 | 3 | 7 | — | — | — | — | — | — |
| 6 | 57 | 31 | 12 | 2 | 10 | — | — | — | — | — | — |
| 7 | 57 | 31 | 12 | 6.5 | — | 0.1 | — | — | — | — | — |
| 8 | 57 | 31 | 12 | 6 | — | 0.5 | — | — | — | — | — |
| 9 | 57 | 31 | 12 | 5 | — | 1.5 | — | — | — | — | — |
| 10 | 57 | 31 | 12 | 4 | — | 3 | — | — | — | — | — |
| 11 | 57 | 31 | 12 | 3 | — | 7 | — | — | — | — | — |
| 12 | 57 | 31 | 12 | 2 | — | 10 | — | — | — | — | — |
| 13 | 57 | 31 | 12 | 5 | 3 | — | 0.1 | — | — | — | — |
| 14 | 57 | 31 | 12 | 4 | 3 | — | 0.5 | — | — | — | — |
| 15 | 57 | 31 | 12 | 2 | 3 | — | 3 | — | — | — | — |
| 16 | 57 | 31 | 12 | 2 | 3 | — | 6 | — | — | — | — |
| 17 | 57 | 31 | 12 | 5 | — | 3 | 0.1 | — | — | — | — |
| 18 | 57 | 31 | 12 | 4 | — | 3 | 0.5 | — | — | — | — |
| 19 | 57 | 31 | 12 | 2 | — | 3 | 3 | — | — | — | — |
| 20 | 57 | 31 | 12 | 2 | — | 3 | 6 | — | — | — | — |
| 21 | 57 | 31 | 12 | 5 | 1.5 | — | — | 0.1 | — | — | — |
| 22 | 57 | 31 | 12 | 4 | 1.5 | — | — | 0.5 | — | — | — |
| 23 | 57 | 31 | 12 | 2 | 1.5 | — | — | 3 | — | — | — |
| 24 | 57 | 31 | 12 | 2 | 1.5 | — | — | 6 | — | — | — |
| 25 | 57 | 31 | 12 | 5 | 1.5 | — | — | — | 0.1 | — | — |
| 26 | 57 | 31 | 12 | 4 | 1.5 | — | — | — | 0.5 | — | — |
| 27 | 57 | 31 | 12 | 2 | 1.5 | — | — | — | 3 | — | — |
| 28 | 57 | 31 | 12 | 2 | 1.5 | — | — | — | 6 | — | — |
| 29 | 57 | 31 | 12 | 5 | 1.5 | — | — | — | — | 0.1 | — |
| 30 | 57 | 31 | 12 | 4 | 1.5 | — | — | — | — | 0.5 | — |
| 31 | 57 | 31 | 12 | 2 | 1.5 | — | — | — | — | 3 | — |
| 32 | 57 | 31 | 12 | 2 | 1.5 | — | — | — | — | 6 | — |
| 33 | 57 | 31 | 12 | 5 | 1.5 | — | — | — | — | — | 0.1 |
| 34 | 57 | 31 | 12 | 4 | 1.5 | — | — | — | — | — | 0.5 |
| 35 | 57 | 31 | 12 | 2 | 1.5 | — | — | — | — | — | 3 |
| 36 | 57 | 31 | 12 | 2 | 1.5 | — | — | — | — | — | 6 |
| 37 | 48 | 40 | 12 | 4 | 1.5 | — | — | — | — | — | — |
| 38 | 52 | 35 | 13 | 4 | 1.5 | — | — | — | — | — | — |
| 39 | 60 | 31 | 9 | 4 | 1.5 | — | — | — | — | — | — |
| 40 | 75 | 20 | 5 | 5.5 | 1.5 | — | — | — | — | — | — |
| 41 | 52 | 31 | 17 | 5.5 | 1.5 | — | — | — | — | — | — |
| 42 | 48 | 32 | 20 | 5.5 | 1.5 | — | — | — | — | — | — |
| 43 | 57 | 31 | 12 | 2 | 1.5 | — | 0.5 | — | 1 | — | — |
| 44 | 57 | 31 | 12 | 2 | 1.5 | 1 | 1 | — | — | — | — |
| 45 | 57 | 31 | 12 | 2 | 1.5 | — | 0.5 | — | — | 0.5 | — |
| 46 | 57 | 31 | 12 | 2 | 1.5 | — | 1 | — | — | — | 1 |
| 47 | 57 | 25 | 18 | 8 | 3 | — | 1.5 | — | — | — | — |
| 48 | 63 | 22 | 15 | 10 | 4 | — | 1.5 | — | — | — | — |

TABLE 2

| Sample No. | Main constituent (wt %) | | | Accessory constituent (parts by weight) | | | | | | | |
|---|---|---|---|---|---|---|---|---|---|---|---|
| | SiO$_2$ | BaO | Al$_2$O$_3$ | MnO | TiO$_2$ | Fe$_2$O$_3$ | MgO | Nb$_2$O$_5$ | CeO$_2$ | ZrO$_2$ | ZnO |
| 49 | 45 | 35 | 20 | 4 | 1.5 | — | — | — | — | — | — |
| 50 | 76 | 20 | 4 | 4 | 1.5 | — | — | — | — | — | — |
| 51 | 73 | 18 | 9 | 4 | 1.5 | — | — | — | — | — | — |
| 52 | 53 | 42 | 5 | 4 | 1.5 | — | — | — | — | — | — |
| 53 | 66 | 31 | 3 | 4 | 1.5 | — | — | — | — | — | — |
| 54 | 50 | 28 | 22 | 4 | 1.5 | — | — | — | — | — | — |
| 55 | 57 | 31 | 12 | 2 | 1.5 | — | — | — | — | — | — |
| 56 | 57 | 31 | 12 | 12 | 1.5 | — | — | — | — | — | — |
| 57 | 57 | 31 | 12 | 4 | — | — | — | — | — | — | — |
| 58 | 57 | 31 | 12 | 4 | 12 | — | — | — | — | — | — |
| 59 | 57 | 31 | 12 | 4 | — | 12 | — | — | — | — | — |
| 60 | 57 | 31 | 12 | 4 | 7 | 7 | — | — | — | — | — |

Next, the raw material powder according to each sample as described above was added with appropriate amounts of an organic binder, a dispersing agent and a plasticizer, to prepare a ceramic slurry, and the slurry was mixed and ground so that an average grain size (D50) of the raw material powder in the slurry was 1.5 μm or less.

Next, the ceramic slurry was molded into a sheet-shaped form by a doctor blade method, dried, and cut into an appropriate size, to obtain a ceramic green sheet having a thickness of 50 μm.

Then, a conductive paste mainly based on copper was printed on a predetermined ceramic green sheet by a screen printing method, to form a conductor pattern which is to become an external conductor film.

Then after cutting the obtained ceramic green sheet into a predetermined size, the sheets were stacked and thermocompression bonded at a temperature of 60 to 80° C., at a pressure of 1000 to 1500 kg/cm$^2$ to obtain an unfired laminate.

Then the unfired laminate was fired at a temperature of 900 to 1000° C. in a non-oxidative atmosphere of nitrogen-hydrogen, to obtain a plate-shaped ceramic sintered sample formed by co-sintering of the ceramic green sheet and the conductor pattern.

Next, for the obtained sample, a L-shaped lead was soldered on a 2 mm$^2$ external conductor film on the surface of the ceramic sintered sample, and bonding strength (electrode peel strength) between the substrate and the external conductor film was measured by a tensile test in the direction perpendicular to the surface. Further, bending strength was measured by a three-point bending test (JIS-R1061).

These evaluation results are shown in Table 3 and Table 4. For the samples shown in Table 4, evaluation results of sintering performance are also shown. Here, the mark "o" in the sintering performance indicates that sintering is finely achieved, on the other hand, the mark "x" in the sintering performance indicates that a compact sintered body is not obtained or over-sintered condition is observed in the aforementioned conditions.

TABLE 3

| Sample No. | Electrode peel strength [N/2 mm$^2$] | Bending strength [MPa] |
| --- | --- | --- |
| 1 | 22 | 230 |
| 2 | 25 | 250 |
| 3 | 30 | 260 |
| 4 | 36 | 260 |
| 5 | 34 | 270 |
| 6 | 31 | 270 |
| 7 | 21 | 240 |
| 8 | 23 | 250 |
| 9 | 29 | 255 |
| 10 | 30 | 260 |
| 11 | 31 | 270 |
| 12 | 31 | 275 |
| 13 | 27 | 250 |
| 14 | 32 | 290 |
| 15 | 35 | 320 |
| 16 | 34 | 320 |
| 17 | 30 | 250 |
| 18 | 34 | 280 |
| 19 | 35 | 310 |
| 20 | 33 | 305 |
| 21 | 32 | 270 |
| 22 | 33 | 290 |
| 23 | 33 | 320 |
| 24 | 31 | 300 |
| 25 | 31 | 270 |
| 26 | 34 | 310 |
| 27 | 34 | 330 |

TABLE 3-continued

| Sample No. | Electrode peel strength [N/2 mm$^2$] | Bending strength [MPa] |
| --- | --- | --- |
| 28 | 33 | 325 |
| 29 | 30 | 290 |
| 30 | 31 | 320 |
| 31 | 33 | 340 |
| 32 | 32 | 330 |
| 33 | 32 | 280 |
| 34 | 32 | 290 |
| 35 | 31 | 300 |
| 36 | 30 | 280 |
| 37 | 27 | 250 |
| 38 | 31 | 260 |
| 39 | 28 | 280 |
| 40 | 27 | 270 |
| 41 | 32 | 260 |
| 42 | 28 | 270 |
| 43 | 35 | 320 |
| 44 | 34 | 330 |
| 45 | 38 | 320 |
| 46 | 29 | 310 |
| 47 | 22 | 260 |
| 48 | 20 | 250 |

TABLE 4

| Sample No. | Sintering performance | Electrode peel strength [N/2 mm$^2$] | Bending strength [MPa] |
| --- | --- | --- | --- |
| 49 | x | — | — |
| 50 | x | — | — |
| 51 | x | — | — |
| 52 | o | 12 | 150 |
| 53 | o | 15 | 180 |
| 54 | x | — | — |
| 55 | x | — | — |
| 57 | x | — | — |
| 58 | o | 18 | 120 |
| 59 | o | 11 | 110 |
| 60 | o | 16 | 140 |

As is apparent from Table 1 and Table 3, the multilayer ceramic substrates of Sample Nos. 1 to 48 including a main constituent ceramic material containing about 48 weight % to about 75 weight % in terms of $SiO_2$ of Si, about 20 weight % to about 40 weight % in terms of BaO of Ba, and about 5 weight % to about 20 weight % in terms of $Al_2O_3$ of Al, and an accessory constituent ceramic material containing, relative to 100 parts by weight of the main constituent ceramic material, about 2 parts to about 10 parts by weight in terms of MnO of Mn and about 0.1 parts to about 10 parts by weight respectively in terms of $TiO_2$ and $Fe_2O_3$ of at least one selected from Ti and Fe, and substantially not including any of Cr oxide and B oxide showed excellent bending strength of about 230 MPa or higher, and high strength of the substrate itself, and showed excellent electrode peel strength of 20 N/2 mm$^2$ or higher, and high bonding strength with the external conductor film. In other words, the multilayer ceramic substrate having a ceramic layer obtained by sintering the low-temperature sintering ceramic material satisfying the aforementioned requirement showed excellent reliability.

Also, for the sintered bodies having compositions according to Sample Nos. 4 to 10, precipitated crystals were identified by diffraction X-ray spectra. As a result, in the sintered body of Sample No. 4, $Ba_2TiSi_2O_8$ precipitated in addition to $SiO_2$ (Quartz), $Al_2O_3$ (Alumina), $BaSi_2O_5$ (Sanbornite), and $BaAl_2Si_2O_8$ (Celsian). On the other hand, in the sintered body of Sample No. 10, precipitation of $Ba_2TiSi_2O_8$ was not observed. Comparison of electrode peel strength between Sample No.4 and Sample No. 10 demonstrates that Sample No. 4 has higher electrode peel strength than Sample No. 10. This reveals that precipitation of $Ba_2TiSi_2O_8$ crystal phase contributes to improvement in electrode peel strength, and it suffices that $TiO_2$ is contained as an accessory constituent for precipitation of this crystal phase.

On the other hand, as is apparent from Table 2 and Table 4, in the Samples Nos. 49 to 60 not containing the main constituent ceramic material described above, a compact sintered body was not obtained, or over-sintered state was observed. It was demonstrated that even when a compact sintered body is obtained, the electrode peel strength and the bending strength are low, and a ceramic substrate with high reliability cannot be obtained.

Experimental Example 2

In the configuration shown in FIG. 2, the first and the second superficial ceramic portions 22 and 23 were formed of the composition according to Sample No. 1 in Experimental Example 1, and the inner layer ceramic portion 24 was formed of the composition according to Sample No.4 in Experimental example 1, and a firing step was conducted in the condition that the superficial ceramic portions 22 and 23 and the inner layer ceramic portion 24 were stacked, to obtain ceramic substrate 21 that is to be a sample.

In this ceramic substrate 21, thickness of each of the first and the second superficial ceramic portions 22 and 23 was 70 μm, and thickness of the inner layer ceramic portion 24 was 860 μm. Also thermal expansion coefficient of the sintered body of the ceramic composition according to Sample No. 1 was 10.1 ppm/° C. On the other hand, thermal expansion coefficient of the sintered body of the ceramic composition according to Sample No. 4 was 11.7 ppm/° C.

Bending strength of the obtained ceramic substrate 21 was 340 MPa. On the other hand, bending strength of Sample No. 1 alone was 230 MPa as shown in Table 3 above, and bending strength of Sample No. 4 alone was 260 MPa. This reveals that according to the ceramic substrate 21 having a composite structure as described above, bending strength can be further improved in comparison with the cases of respective ones of the superficial ceramic portions 22 and 23 and the inner layer ceramic portion 24.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A low-temperature sintering ceramic material comprising a main constituent ceramic material containing about 48 weight % to about 75 weight % in terms of $SiO_2$ of Si, about 20 weight % to about 40 weight % in terms of BaO of Ba, and about 5 weight % to about 20 weight % in terms of $Al_2O_3$ of Al, and an accessory constituent ceramic material containing, relative to 100 parts by weight of the main constituent ceramic material, about 2 parts to about 10 parts by weight in terms of MnO of Mn and about 0.1 parts to about 10 parts by weight respectively in terms of $TiO_2$ and $Fe_2O_3$ of at least one selected from Ti and Fe, and substantially not comprising either of Cr oxide and B oxide.

2. The low-temperature sintering ceramic material according to claim 1, further comprising, as said accessory constituent ceramic material, about 0.1 parts to about 6 parts by weight in terms of MgO of Mg, relative to 100 parts by weight of said main constituent ceramic material.

3. The low-temperature sintering ceramic material according to claim 1, further comprising, as said accessory constituent ceramic material, about 0.1 parts to about 6 parts by weight in terms of respectively $Nb_2O_5$, $CeO_2$, $ZrO_2$ and ZnO of at least one selected from Nb, Ce, Zr and Zn, relative to 100 parts by weight of said main constituent ceramic material.

4. A ceramic substrate comprising a ceramic layer made of a sintered low-temperature sintering ceramic material including a main constituent ceramic material containing about 48 weight % to about 75 weight % in terms of $SiO_2$ of Si, about 20 weight % to about 40 weight % in terms of BaO of Ba, and about 5 weight % to about 20 weight % in terms of $Al_2O_3$ of Al, and an accessory constituent ceramic material containing, relative to 100 parts by weight of the main constituent ceramic material, about 2 parts to about 10 parts by weight in terms of MnO of Mn and about 0.1 to about 10 parts by weight respectively in terms of $TiO_2$ and $Fe_2O_3$ of at least one selected from Ti and Fe, and substantially not including either of Cr oxide and B oxide.

5. The ceramic substrate according to claim 4, wherein said low-temperature sintering ceramic material further includes, as said accessory constituent ceramic material, about 0.1 parts to about 6 parts by weight in terms of MgO of Mg, relative to 100 parts by weight of said main constituent ceramic material.

6. The ceramic substrate according to claim 4, wherein said low-temperature sintering ceramic material further includes, as said accessory constituent ceramic material, about 0.1 parts to about 6 parts by weight in terms of respectively $Nb_2O_5$, $CeO_2$, $ZrO_2$ and ZnO of at least one selected from Nb, Ce, Zr and Zn is further contained, relative to 100 parts by weight of said main constituent ceramic material.

7. The ceramic substrate according to claim 4, comprising a laminate including a plurality of said ceramic layers, and a conductor pattern containing at least one selected from gold, silver and copper as a main constituent provided on a surface inside of said laminate.

8. The ceramic substrate according to claim 4, wherein said low-temperature sintering ceramic material contains $TiO_2$ as said accessory constituent ceramic material, and $Ba_2TiSi_2O_8$ crystal is precipitated in said ceramic layer.

* * * * *